United States Patent [19]
Takanshi et al.

[11] Patent Number: 5,315,410
[45] Date of Patent: May 24, 1994

[54] METHOD AND APPARATUS FOR RECORDING OPTICAL INFORMATION BY USING A PHOTOELECTRIC TRANSDUCER

[75] Inventors: Itsuo Takanshi, Kamakura; Shintaro Nakagaki, Miura; Tsutou Asakura; Masato Furuya, both of Yokomaha; Yoshihisa Koyama, Yokosuka; Yuji Uchiyama, Chigasaki, all of Japan

[73] Assignee: Victor Company of Japan, Ltd., Yokohama, Japan

[21] Appl. No.: 653,538

[22] Filed: Feb. 8, 1991

[30] Foreign Application Priority Data

| Feb. 12, 1990 | [JP] | Japan | 2-29938 |
| Feb. 22, 1990 | [JP] | Japan | 2-41529 |
| Feb. 23, 1990 | [JP] | Japan | 2-43838 |
| Feb. 28, 1990 | [JP] | Japan | 2-48111 |
| Mar. 23, 1990 | [JP] | Japan | 2-74390 |
| Jan. 29, 1991 | [JP] | Japan | 3-028108 |

[51] Int. Cl.$^5$ .............. H04N 1/028; H04N 3/15; G02F 1/135
[52] U.S. Cl. ...................... 358/471; 359/72; 348/294; 348/230; 348/367
[58] Field of Search ............... 358/213.11, 213.13, 358/225, 229, 471, 474, 482; 359/72

[56] References Cited

FOREIGN PATENT DOCUMENTS

| 273773  | 7/1988  | European Pat. Off. |
| 0342058 | 11/1989 | European Pat. Off. |
| 0351880 | 1/1990  | European Pat. Off. |
| 0354688 | 2/1990  | European Pat. Off. |

Primary Examiner—Edward L. Coles, Sr.
Assistant Examiner—Scott A. Rogers
Attorney, Agent, or Firm—Lowe, Price, LeBlanc & Becker

[57] ABSTRACT

A system has a first electrode, a second electrode, a photosensitive member located between the first and second electrodes, a recording member located between the first and second electrodes, and an optical shutter. In this system, light having information to be recorded is applied to the photosensitive member. The light information is recorded on the recording member. An exposure amount of the light with respect to the photosensitive member is set by setting a time during which the optical shutter remains open. A drive voltage of a predetermined variation manner is applied between the first and second electrodes during the recording of the light information on the recording member.

13 Claims, 12 Drawing Sheets

FIG. 3 (a)(b) 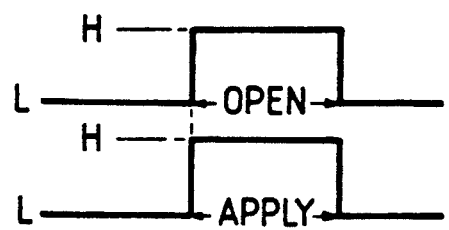
FIG. 4 (a)(b) 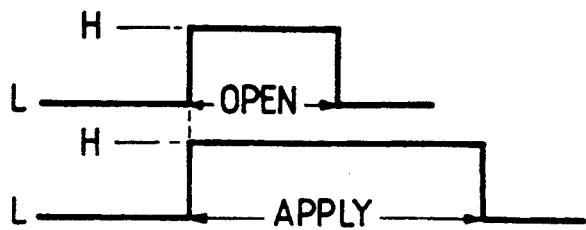
FIG. 5 (a)(b) 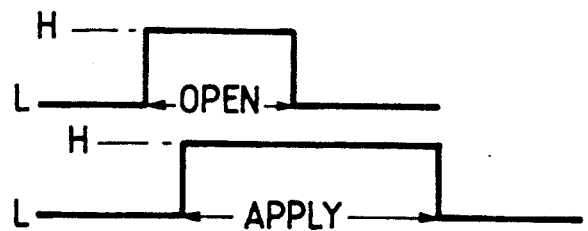
FIG. 6 (a)(b) 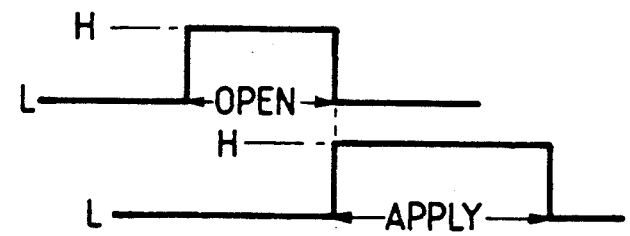
FIG. 7 (a)(b) 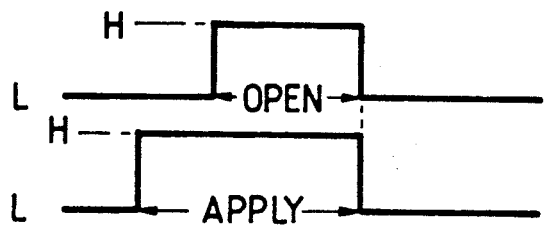
FIG. 8 (a)(b) 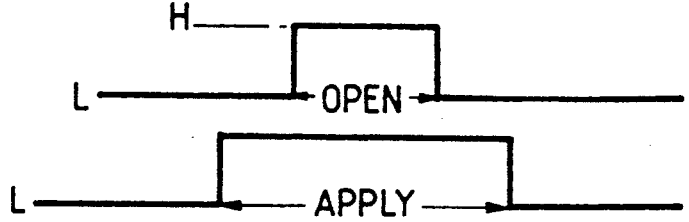

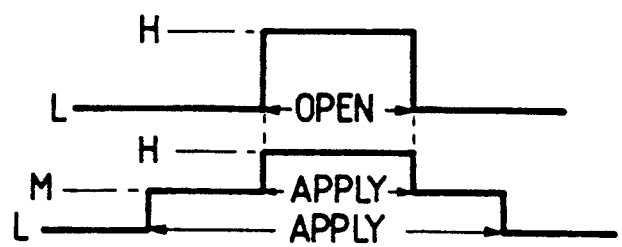
FIG. 13 (a)(b)
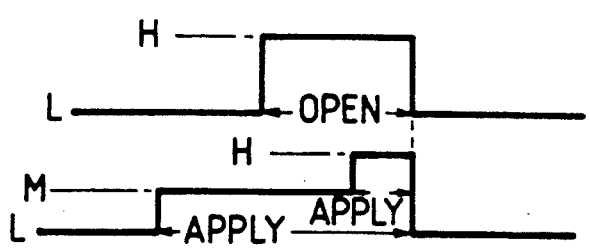
FIG. 14 (a)(b)
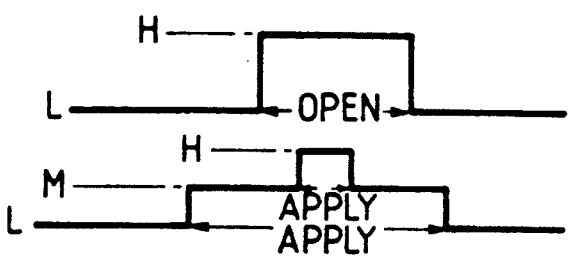
FIG. 15 (a)(b)
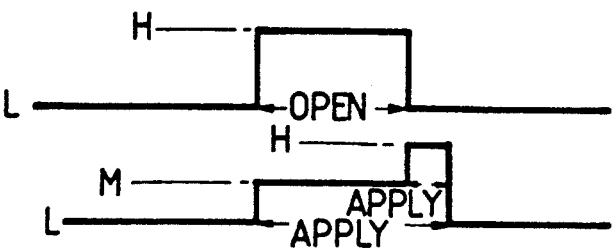
FIG. 16 (a)(b)

METHOD AND APPARATUS FOR RECORDING OPTICAL INFORMATION BY USING A PHOTOELECTRIC TRANSDUCER

BACKGROUND OF THE INVENTION

This invention relates to a method and an apparatus for recording image information.

New technologies have been developed in the field of recording information. One known example of such new technologies generates a charge latent image in a charge storage recording medium on the basis of an input optical image by use of a photoelectric transducer device including a photoconductive member.

SUMMARY OF THE INVENTION

It is an object of this invention to provide an improved method of recording information.

It is another object of this invention to provide an improved apparatus for recording information.

According to a first aspect of this invention, in a system having a first electrode, a second electrode, a photosensitive member located between the first and second electrodes, a recording member located between the first and second electrodes, and an optical shutter, a method comprises the steps of applying light to the photosensitive member, the light having information to be recorded; recording the light information on the recording member; setting an exposure amount of the light with respect to the photosensitive member by setting a time during which the optical shutter remains open; and applying a drive voltage of a predetermined variation manner between the first and second electrodes during the recording of the light information on the recording member.

According to a second aspect of this invention, in a system having a first electrode, a second electrode, a photosensitive member located between the first and second electrodes, a recording member located between the first and second electrodes, and an optical shutter, a method comprises the steps of applying a predetermined voltage between the first and second electrodes during a predetermined period; applying light to the photosensitive member, the light having information to be recorded;

recording the light information on the recording member; and during a period different from the predetermined period of the application of the predetermined voltage, setting a voltage between the first and second electrodes in a condition where the recording member remains unchanged.

According to a third aspect of this invention, an apparatus comprises an optical shutter for setting an exposure light amount; a photosensitive member exposed to an optical image of an object when the optical shutter is open; a recording member recording information corresponding to the optical image when the optical shutter is open; first and second electrodes for applying an electric field to the photosensitive member and the recording member when a potential is applied between the first and second electrodes; means for applying a voltage between the first and second electrodes; and means for changing the voltage applied between the first and second electrodes.

According to a fourth aspect of this invention, in a system having a first electrode, a second electrode, a photosensitive member located between the first and second electrodes, and a photo-modulation member located between the first and second electrodes, a method comprises the steps of applying a predetermined voltage between the first and second electrodes; applying light to the photosensitive member, the light having information to be recorded; recording the light information on the photo-modulation member; the improvement comprising sensing a condition of the photo-modulation member; and controlling the predetermined voltage between the first and second electrodes in response to the sensed condition of the photo-modulation member.

According to a fifth aspect of this invention, an apparatus comprises a first electrode, a second electrode, a photosensitive member located between the first and second electrodes, and a photo-modulation member located between the first and second electrodes, means for applying a predetermined voltage between the first and second electrodes, means for applying light to the photosensitive member, the light having information to be recorded, and means for recording the light information on the photo-modulation member; the improvement comprising means for sensing a condition of the photo-modulation member; and means for controlling the predetermined voltage between the first and second electrodes in response to the sensed condition of the photo-modulation member.

According to a sixth aspect of this invention, in a system having a first electrode, a second electrode, a photosensitive member located between the first and second electrodes, and a recording member located between the first and second electrodes, a method comprises the steps of applying a predetermined voltage between the first and second electrodes; applying light to the photosensitive member, the light having information to be recorded; recording the light having information on the recording member; the improvement comprising using an ac voltage as the predetermined voltage applied between the first and second electrodes.

According to a seventh aspect of this invention, an apparatus comprises a first electrode, a second electrode, a photosensitive member located between the first and second electrodes, a recording member located between the first and second electrodes, means for applying a predetermined voltage between the first and second electrodes, means for applying light to the photosensitive member, the light having information to be recorded, and means for recording the light information on the recording member; the improvement wherein the predetermined voltage includes an ac voltage.

According to an eighth aspect of this invention, in a system having a first electrode, a second electrode, a photosensitive member located between the first and second electrodes, and a recording member located between the first and second electrodes, a method comprises the steps of applying a predetermined voltage between the first and second electrodes; applying light to the photosensitive member, the light having information to be recorded; recording the light information on the recording member; the improvement comprising setting a period during which the predetermined voltage remains applied between the first and second electrodes; and setting a level of the predetermined voltage in dependence on the set period of the application of the predetermined voltage.

According to a ninth aspect of this invention, an apparatus comprises a first electrode, a second electrode, a photosensitive member located between the first and second electrodes, a recording member located between the first and second electrodes, means for applying a predetermined voltage between the first and second electrodes, means for applying light to the photosensitive member, the light having information to be recorded, and means for recording the light information on the recording member; the improvement comprising means for setting a period during which the predetermined voltage remains applied between the first and second electrodes; and means for setting a level of the predetermined voltage in dependence on the set period of the application of the predetermined voltage.

According to a tenth aspect of this invention, in a system having a first electrode, a second electrode, a photosensitive member located between the first and second electrodes, and a recording member located between the first and second electrodes, a method comprises the steps of applying a predetermined voltage between the first and second electrodes; applying light to the photosensitive member, the light having information to be recorded; recording the light information on the recording member; the improvement comprising using periodical voltage pulses as the predetermined voltage applied between the first and second electrodes.

According to an eleventh aspect of this invention, an apparatus comprises a first electrode, a second electrode, a photosensitive member located between the first and second electrodes, a recording member located between the first and second electrodes, means for applying a predetermined voltage between the first and second electrodes, means for applying light to the photosensitive member, the light having information to be recorded, and means for recording the light information on the recording member; the improvement wherein the predetermined voltage applied between the first and second electrodes includes periodical voltage pulses.

According to a twelfth aspect of this invention, an apparatus comprises a first electrode, a second electrode, a photoconductive member located between the first and second electrodes, and a photo-modulation member located between the first and second electrodes, means for applying a predetermined voltage between the first and second electrodes, means for applying light to the photosensitive member, the light having information to be recorded, and means for recording the light information on the photo-modulation member; the improvement comprising: means for applying reference light to the photoconductive member and the photo-modulation member; means for detecting an intensity of the reference light which exits from the photo-modulation member; and means for controlling the predetermined voltage between the first and second electrodes in response to the sensed intensity of the reference light.

BRIEF DESCRIPTION OF THE DRAWINGS

FIGS. 3-8 are timing diagrams showing examples of the relation between the period during which the shutter remains open and the period during which the dc voltage remains applied between the electrodes in the embodiment of FIG. 1.

FIGS. 13-16 are timing diagrams showing examples of the relation among the period during which the shutter remains open, the period during which the dc voltage remains applied between the electrodes, and the period during which the bias dc voltage remains applied between the electrodes in the embodiment of FIG. 12.

DESCRIPTION OF THE FIRST PREFERRED EMBODIMENT

Figure 1:
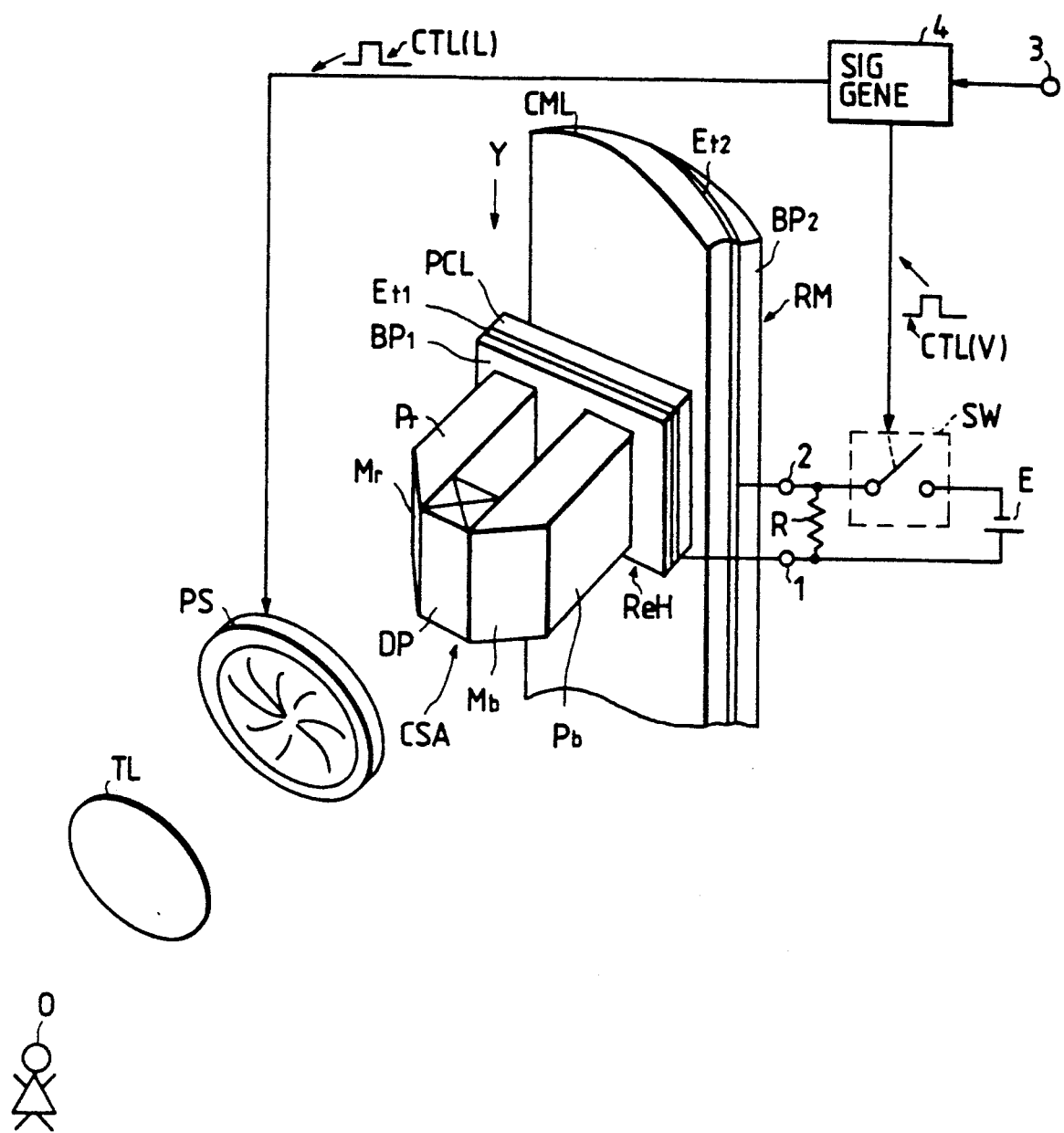
FIG. 1 is a diagram of an information recording apparatus according to a first embodiment of this invention.

With reference to FIG. 1, a lens TL, a mechanical shutter PS, an optical color separator CSA, a recording head ReH, and a recording medium RM are arranged in the order along a direction of travel of light representing a scene of an object O whose image is to be recorded. When the shutter PS is open, the light representing the scene of the object O travels to the optical color separator CSA via the lens TL and the shutter PS. When the shutter PS is closed, the light representing the scene of the object O is blocked.

The optical color separator CSA includes a dichroic mirror or a dichroic prism Dp extending between prisms Pr and Pb having respective total reflection surfaces Mr and Mb. The dichroic prism Dp includes a mirror or an R surface reflecting red light but conducting green and blue light, and a mirror or a B surface reflecting blue light but conducting green and red light. The R surface and the B surface are perpendicular to each other.

When the shutter PS is open and thus the light from the object O is incident to the dichroic prism Dp of the optical color separator CSA, green components of the incident light pass through the dichroic prism Dp and form a green image of the object O on the recording head ReH. Red components of the light are reflected by the R surface of the dichroic prism Dp and are then reflected by the total reflection surface Mr of the prism Pr, forming a red image of the object O on the recording head ReH. Blue components of the light are reflected by the B surface of the dichroic prism Dp and are then reflected by the total reflection surface Mb of the prism Pb, forming a blue image of the object O on the recording head ReH. In this way, red, green, and blue images of the object O are formed on separate regions of the recording head ReH respectively.

The recording head ReH has a laminated structure of a transparent base plate (for example, a glass base plate) BP1, a transparent electrode Et1, and a photoconductive layer PCL which are arranged in the order along the direction of the travel of the light. The transparent electrode Et1 is made of, for example, ITO (indium tin oxide). The photoconductive layer PCL is made of, for example, amorphous silicon. The photoconductive layer PCL is exposed to the red image, the green image, and the blue image of the object O via the transparent base plate BP1 and the transparent electrode Et1.

The recording medium RM has a laminated structure of a recording layer CML, an electrode Et2, and a base plate BP2 which are arranged in the order. The recording layer CML of the recording medium RM opposes the photoconductive layer PCL of the recording head ReH.

The recording layer CML is made of various materials such as silicone resin, liquid crystal, PLZT, electrochromic substances. The recording layer CML may be composed of a complex film of high molecular material and liquid crystal material. In the complex film, the liquid crystal is dispersed or impregnated in the high molecular material. It is preferable that the high molecular material has a volume resistivity of $10^{14}\Omega$ cm or higher. The high molecular material is selected from various substances such as methacrylic resin, polyester resin, polycarbonate resin, vinyl chloride resin, polyamide resin, polyethylene resin, polypropylene resin, polystyrene resin, and silicone resin. The liquid crystal is selected from various substances such as smectic liquid crystal and nematic liquid crystal which assume a phase exhibiting characters of liquid crystal at a room temperature.

The electrodes Et1 and Et2 are electrically connected to terminals 1 and 2 respectively. The terminal 1 is connected to the positive terminal of a dc power source E. The terminal 2 is connected to the negative terminal of the dc power source E via a switch SW. A resistor R corresponding to a low impedance is connected between the terminals 1 and 2. When the switch SW is closed, a predetermined dc voltage is applied between the electrodes Et1 and Et2 by the dc power source E so that a electric field of a predetermined intensity can be generated between the electrodes Et1 and Et2. The dc voltage applied between the electrodes Et1 and Et2 is set higher than a voltage at which a space discharge between the photoconductive layer PCL and the recording layer CML starts to occur. Since the photoconductive layer PCL and the recording layer CML are located between the electrodes Et1 and Et2, the photoconductive layer PCL and the recording layer CML are exposed to the electric field generated between the electrodes Et1 and Et2.

Under conditions where the shutter PS is open and the switch SW is closed, the three color images of the object O are formed on the photoconductive layer PCL of the recording head ReH and the electric field is generated between the electrodes Et1 and Et2. The electric resistance of the photoconductive layer PCL varies with the three color images of the object O. Thus, a two-dimensional distribution of the electric field in the gap between the photoconductive layer PCL of the recording head ReH and the recording layer CML of the recording medium RM varies in accordance with the three color images of the object O. A space discharge occurs across the gap between the photoconductive layer PCL and the recording layer CML in response to the electric field, so that charge latent images corresponding to the three color images are formed on the recording layer CML of the recording medium RM.

The recording medium RM can be moved relative to the recording head ReH in a direction Y by a known drive mechanism (not shown).

When the shutter PS is closed, the exposure of the photoconductive layer PCL of the recording head ReH to the light representative of the image of the object O is inhibited and thus the formation of the charge latent images on the recording layer CML of the recording medium RM is inhibited. The amount of the exposure light is determined by the period during which the shutter PS remains open. When the application of the dc voltage between the electrodes Et1 and Et2 is removed, the formation of the charge latent images on the recording layer CML of the recording medium RM is inhibited. Thus, the switch SW serves as an electronic shutter.

The shutter PS is periodically opened and closed. In addition, the switch SW is periodically closed and opened. The timing control of the operation of the switch SW have a predetermined relation with the timing control of the operation of the shutter PS. The period during which the switch SW is closed is chosen in dependence on the recording characteristics of the recording layer CML of the recording medium RM so as to enable a good recording of the charge latent images on the recording layer CML.

A signal generator 4 generates control pulse signals CTL(V) and CTL(L) in response to a trigger pulse signal fed via a terminal 3. The control pulse signal CTL(V) is fed to the control terminal of the switch SW. When the control pulse signal CTL(V) assumes a high level, the switch SW is closed. When the control pulse signal CTL(V) assumes a low level, the switch SW is opened. The control pulse signal CTL(L) is fed to an actuator of the shutter PS. When the control pulse signal CTL(L) assumes a high level, the shutter PS is opened by the actuator. When the control pulse signal CTL(L) assumes a low level, the shutter PS is closed by the actuator.

Figure 2:
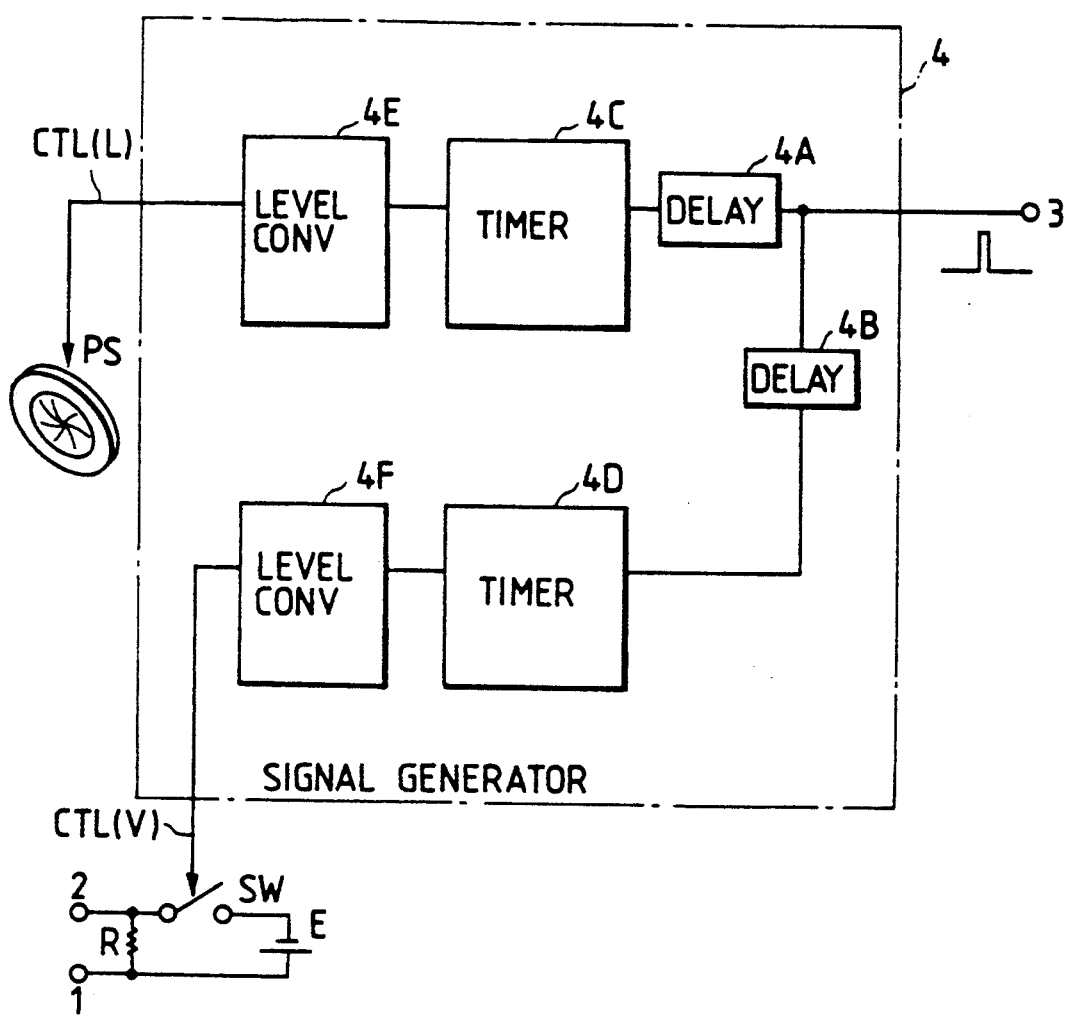
FIG. 2 is a block diagram of the signal generator of FIG. 1.

As shown in FIG. 2, the signal generator 4 includes adjustable delay circuits 4A and 4B, timers (monostable multivibrators) 4C and 4D, and level converters (amplifiers) 4E and 4F. The trigger pulse signal is fed to the timers 4C and 4D via the delay circuits 4A and 4B respectively. The timer 4C generates the control pulse signal CTL(L) in response to the delayed trigger pulse signal. The control pulse signal CTL(L) is fed to the shutter PS via the level converter 4E. The timer 4D generates the control pulse signal CTL(V) in response to the delayed trigger pulse signal. The control pulse signal CTL(V) is fed to the switch SW via the level converter 4F.

FIGS. 3-8 show examples of the timing relation between the period during which the shutter PS remains open and the period during which the dc voltage remains applied between the electrodes Et1 and Et2. The part (a) of each of FIGS. 3-8 shows the period during which the shutter PS remains open. The part (b) of each of FIGS. 3-8 shows the period during which the dc voltage remains applied between the electrodes Et1 and Et2. In the later description, the period during which the shutter PS remains open will be referred to as the shutter open period, and the period during which the dc voltage remains applied between the electrodes Et1 and Et2 will be referred to as the voltage application period. In FIG. 3, the shutter open period agrees with the voltage application period in timing and length. In FIG. 4, the shutter open period agrees with a former part of the voltage application period in timing and length. In FIG. 5, the shutter open period starts before the voltage application period starts, and the shutter open period ends at a moment within the voltage application period. In FIG. 6, the shutter open period starts before the voltage application period starts, and the shutter open period ends at the same time as the moment of the start of the voltage application period. In FIG. 7, the shutter open period starts after the voltage application period starts, and the shutter open period ends at the same time as the moment of the end of the voltage application period. In FIG. 8, the shutter open period starts after the voltage application period starts, and the shutter open period ends before the voltage application period ends.

In general, recorded charge latent images on the recording layer CML of the recording medium RM tend to be deteriorated by charges staying in a capacitance between the electrodes Et1 and Et2. In this embodiment, while the switch SW remains open, the electrodes Et1 and Et2 are connected via the low impedance determined by the resistor R. The connection between the electrodes Et1 and Et2 via the low impedance prevents charges from staying in the capacitance between the electrodes Et1 and Et2, so that the deterioration of the recorded charge latent images on the recording layer CML of the recording medium RM can be prevented.

DESCRIPTION OF THE SECOND PREFERRED EMBODIMENT

Figure 9:
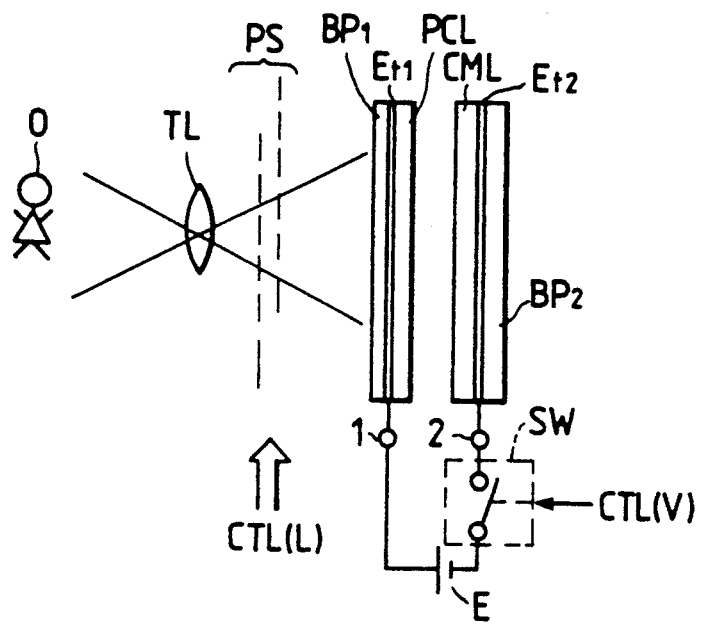
FIG. 9 is a diagram of an information recording apparatus according to a second embodiment of this invention.

FIG. 9 shows a second embodiment of this invention which is similar to the embodiment of FIGS. 1-8 except that the optical color separator CSA (see FIG. 1) and the resistor R (see FIG. 1) are omitted. In the embodiment of FIG. 9, a single image of the object O is formed on the photoconductive layer PCL of the recording head ReH, and a corresponding single charge latent image is formed on the recording layer CML of the recording medium RM.

DESCRIPTION OF THE THIRD PREFERRED EMBODIMENT

Figure 10:
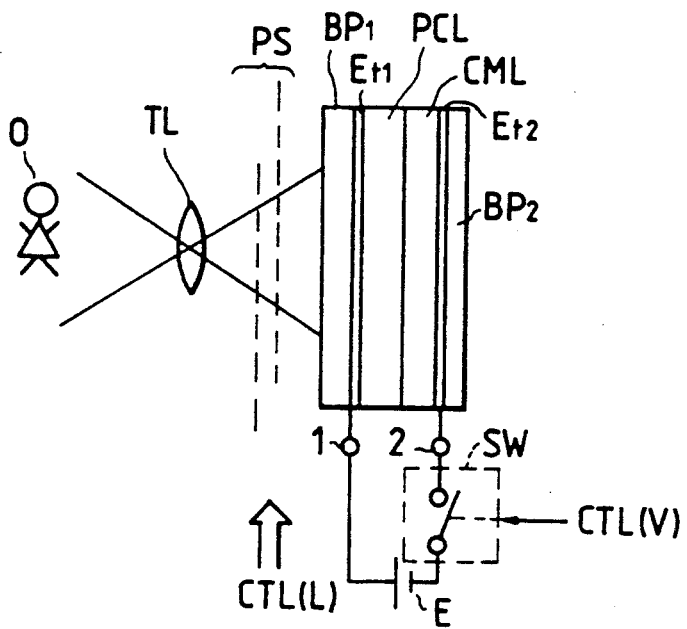
FIG. 10 is a diagram of an information recording apparatus according to a third embodiment of this invention.

FIG. 10 shows a third embodiment of this invention which is similar to the embodiment of FIG. 9 except that the photoconductive layer PCL of the recording head ReH and the recording layer CML of the recording medium RM are in contact with each other.

DESCRIPTION OF THE FOURTH PREFERRED EMBODIMENT

Figure 11:
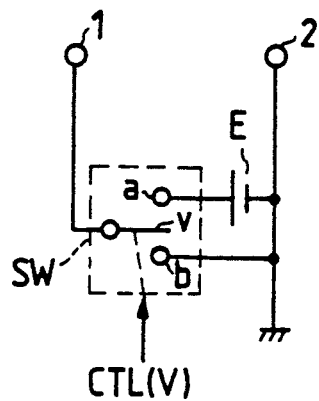
FIG. 11 is a diagram of a part of an information recording apparatus according to a fourth embodiment of this invention.

FIG. 11 shows a fourth embodiment of this invention which is similar to the embodiment of FIG. 9 except for the following design changes. In the embodiment of FIG. 11, a switch SW has a movable contact "v" and fixed contacts "a" and "b". The movable contact "v" is selectively connected to one of the fixed contacts "a" and "b". The movable contact "v" is connected to the terminal 1. The fixed contact "a" is connected to the positive terminal of the dc power source E. The fixed contact "b" is grounded. The negative terminal of the dc power source E is connected to the terminal 2, and is grounded. When the control pulse signal CTL(V) applied to the switch SW assumes the high level, the movable contact "v" of the switch SW is connected to the fixed contact "a" so that the dc voltage is applied between the electrodes Et1 and Et2 (see FIG. 9). When the control pulse signal CTL(V) assumes the low level, the movable contact "v" of the switch SW is connected to the fixed contact "b" so that the application of the dc voltage between the electrodes Et1 and Et2 (see FIG. 9) is removed and the electrode Et1 is grounded.

DESCRIPTION OF THE FIFTH PREFERRED EMBODIMENT

Figure 12:
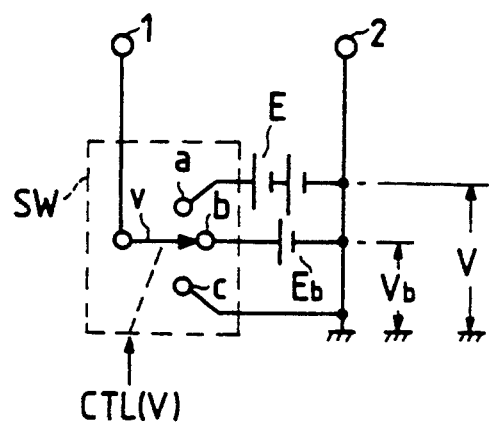
FIG. 12 is a diagram of a part of an information recording apparatus according to a fifth embodiment of this invention.

FIG. 12 shows a fifth embodiment of this invention which is similar to the embodiment of FIG. 9 except for the following design changes. In the embodiment of FIG. 12, a switch SW has a movable contact "v" and fixed contacts "a", "b", and "c". The movable contact "v" is selectively connected to one of the fixed contacts "a", "b", and "c". The movable contact "v" is connected to the terminal 1. The fixed contact "a" is connected to the positive terminal of the dc power source E. The fixed contact "b" is connected to the positive terminal of a bias dc power source Eb. The fixed contact "c" is connected to the terminal 2, and is grounded. The negative terminals of the dc power source E and the bias dc power source Eb are connected to the terminal 2, and are grounded. The bias voltage generated by the bias dc power source Eb is lower than the voltage generated by the dc power source E. The control signal CTL(V) applied to the switch SW is changeable among three different states. When the control signal CTL(V) assumes the first state, the movable contact "v" of the switch SW is connected to the fixed contact "a" so that the higher voltage is applied between the electrodes Et1 and Et2 (see FIG. 9). When the control signal CTL(V) assumes the second state, the movable contact "v" of the switch SW is connected to the fixed contact "b" so that the lower bias voltage is applied between the electrodes Et1 and Et2 (see FIG. 9). When the control signal CTL(V) assumes the third state, the movable contact "v" of the switch SW is connected to the fixed contact "c" so that the voltage application between the electrodes Et1 and Et2 (see FIG. 9) is removed and the electrodes Et1 and Et2 are directly coupled to each other.

FIGS. 13-16 show examples of the timing relation among the period during which the shutter PS remains open, the period during which the dc voltage remains applied between the electrodes Et1 and Et2, and the period during which the bias dc voltage remains applied between the electrodes Et1 and Et2. The part (a) of each of FIGS. 13-16 shows the period during which the shutter PS remains open. The part (b) of each of FIGS. 13-16 shows the period during which the dc voltage remains applied between the electrodes Et1 and Et2, and the period during which the bias dc voltage remains applied between the electrodes Et1 and Et2. In the part (b) of each of FIGS. 13-16, the level H corresponds to the period during which the dc voltage remains applied between the electrodes Et1 and Et2, and the level M corresponds to the period during which the bias dc voltage remains applied between the electrodes Et1 and Et2. In the later description: the period during which the shutter PS remains open will be referred to as the shutter open period; the period during which the dc voltage remains applied between the electrodes Et1 and Et2 will be referred to as the voltage application period; and the period during which the bias dc voltage remains applied between the electrodes Et1 and Et2 will be referred to as the bias application period. In FIG. 13, the shutter open period agrees with the voltage application period in timing and length, and the bias application periods precede and follow the voltage application period respectively. In FIG. 14, the voltage application period agrees with a later part of the shutter open period in timing and length, and the bias application period starts before the shutter open period starts and the bias application period precedes the voltage application period. In FIG. 15, the voltage application period is contained in the shutter open period, and the bias application periods precede and follow the voltage application period respectively. In FIG. 15, the former bias application period starts before the shutter open period starts, and the latter bias application period ends after the shutter open period ends. In FIG. 16, the bias application period agrees with the shutter open period in timing and length, and the voltage application period follows the bias application period.

DESCRIPTION OF THE SIXTH PREFERRED EMBODIMENT

Figure 17:
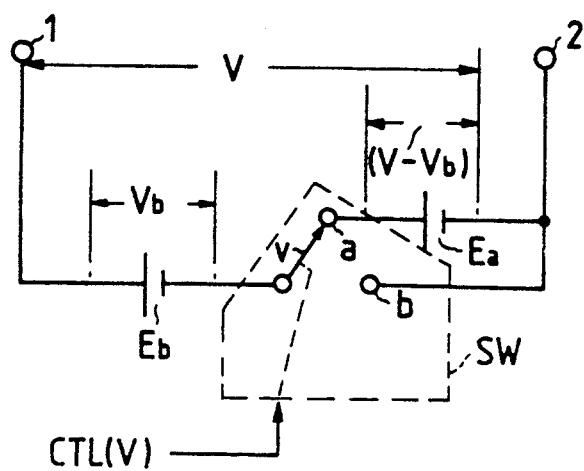
FIG. 17 is a diagram of a part of an information recording apparatus according to a sixth embodiment of this invention.

FIG. 17 shows a sixth embodiment of this invention which is similar to the embodiment of FIG. 11 except for the following design changes. In the embodiment of FIG. 17, the terminal 1 is connected to the positive terminal of a bias dc power source Eb, and the negative terminal of the bias dc power source Eb is connected to the movable contact "v" of the switch SW. The fixed contact "a" of the switch SW is connected to the positive terminal of a dc power source Ea. The negative terminal of the dc power source Ea and the fixed contact "b" of the switch SW are connected to the terminal 2. When the movable contact "v" of the switch SW is connected to the fixed contact "a", a higher voltage is applied between the electrodes Et1 and Et2 (see FIG. 9). When the movable contact "v" of the switch SW is connected to the fixed contact "b", a lower bias voltage is applied between the electrodes Et1 and Et2 (see FIG. 9).

DESCRIPTION OF THE SEVENTH PREFERRED EMBODIMENT

Figure 18:
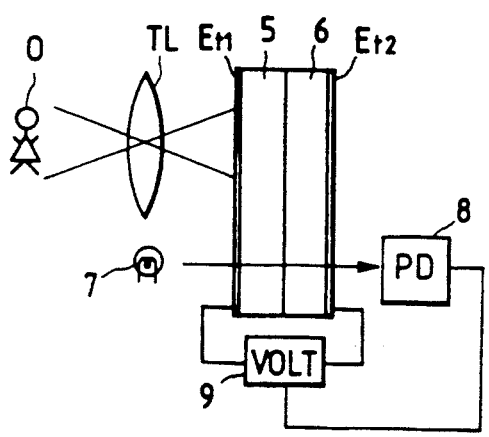
FIG. 18 is a diagram of an information recording apparatus according to a seventh embodiment of this invention.

With reference to FIG. 18, a lamination of a photosensitive layer 5 and a photo-modulation layer 6 is sandwiched between transparent electrodes Et1 and Et2. The photosensitive layer 5 corresponds to the photoconductive layer PCL of FIG. 1. The photo-modulation layer 6 corresponds to the recording layer CML of FIG. 1. A variable dc voltage source 9 is electrically connected between the electrodes Et1 and Et2 so that the dc voltage across the voltage source 9 is applied between the electrodes Et1 and Et2. The application of the dc voltage to the electrodes Et1 and Et2 generates an electric field between the electrodes Et1 and Et2.

An optical image of an object O is formed via a lens TL on the photosensitive layer 5. The impedance of the photosensitive layer 5 varies in accordance with the optical image of the object O, so that the electric field applied to the photo-modulation layer 6 depends on the optical image of the object O. The application of the image-dependent electric field to the photo-modulation layer 6 forms a charge latent image on the photo-modulation layer 6. The charge latent image corresponds to the optical image of the object O.

Reference light emitted from a light source 7 is transmitted to a photo detector 8 via the electrode Et1, the photosensitive layer 5, the photo-modulation layer 6, and the electrode Et2. The reference light incident to the photo detector 8 is converted by the photo detector 8 into a corresponding electric signal. The electric signal is outputted from the photo detector 8 to the control terminal of the variable dc voltage source 9 so that the dc voltage applied between the electrodes Et1 and Et2 will depend on the electric signal. Since the electric signal represents a transmittance condition of the photo-modulation layer 6, the dc voltage applied between the electrodes Et1 and Et2 is controlled in response to the condition of the photo-modulation layer 6. The control of the dc voltage applied between the electrodes Et1 and Et2 in response to the condition of the photo-modulation layer 6 is designed so that the formation of the charge latent image on the photo-modulation layer 6 can be executed at a constant operating condition point.

Figure 19:
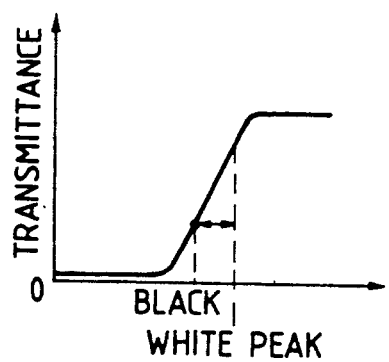
FIG. 19 is a graph showing the relation between the image exposure light and the transmittance of the photo-modulation layer in the embodiment of FIG. 18.

The reference light emitted from the light source 7 is set to the black level of the object O, the white peak of the object O, or an intermediate level between the black level and the white peak of the object O which are illustrated in FIG. 19.

Figure 20:
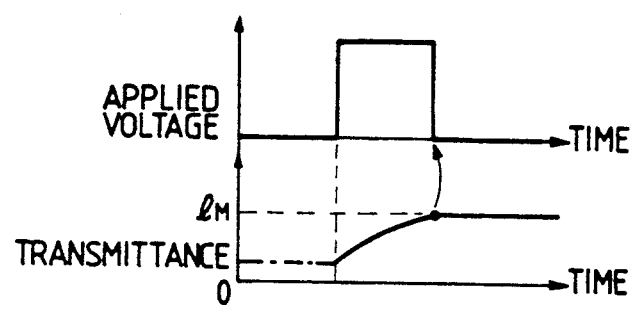
FIG. 20 is a timing diagram showing the relation between the transmittance and the period of the application of the voltage in the embodiment of FIG. 18.

The period during which the dc voltage remains applied between the electrodes Et1 and Et2 may be varied in accordance with the output electric signal from the photo detector 8. In this case, as shown in FIG. 20, the application of the dc voltage between the electrodes Et1 and Et2 may be removed when the transmittance of the photo-modulation layer 6 increases to a predetermined level $l_M$.

The photosensitive layer 5 and the photo-modulation layer 6 may be separated by a predetermined gap.

DESCRIPTION OF THE EIGHTH PREFERRED EMBODIMENT

Figure 21:
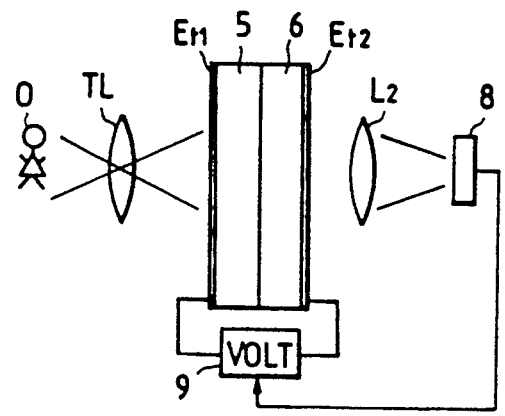
FIG. 21 is a diagram of an information recording apparatus according to an eighth embodiment of this invention.

FIG. 21 shows an eighth embodiment of this invention which is similar to the embodiment of FIGS. 18 and 19 except for the following design changes. In the embodiment of FIG. 21, light from the object O successively passes through the lens TL, the electrode Et1, the photosensitive layer 5, the photo-modulation layer 6, and the electrode Et2. After the light passes through the electrode Et2, the light is condensed by a lens L2 and is then incident to the photo detector 8. Thus, the light from the object O which passes through the electrode Et2 is used in place of the reference light of the embodiment of FIGS. 18 and 19.

DESCRIPTION OF THE NINTH PREFERRED EMBODIMENT

Figure 22:
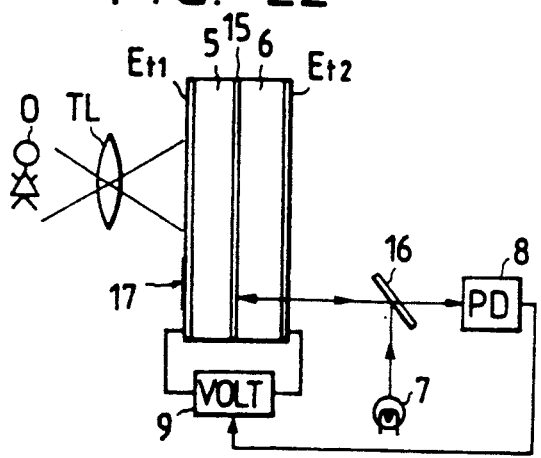
FIG. 22 is a diagram of an information recording apparatus according to a ninth embodiment of this invention.

FIG. 22 shows a ninth embodiment of this invention which is similar to the embodiment of FIGS. 18 and 19 except for the following design changes. In the embodiment of FIG. 22, a mirror layer 15 is sandwiched between the photosensitive layer 5 and the photo-modulation layer 6. In the embodiment of FIG. 22, reference light emitted from the light source 7 is reflected by a semitransparent mirror 16, and is then travels to the mirror layer 15 through the electrode Et2 and the photo-modulation layer 6. The reference light is reflected by the mirror layer 15 and then moves back to the semitransparent mirror 16 through the photo-modulation layer 6 and the electrode Et2. The reference light passes through the semitransparent mirror 16 and enters the photo detector 8.

DESCRIPTION OF THE TENTH PREFERRED EMBODIMENT

Figure 23:
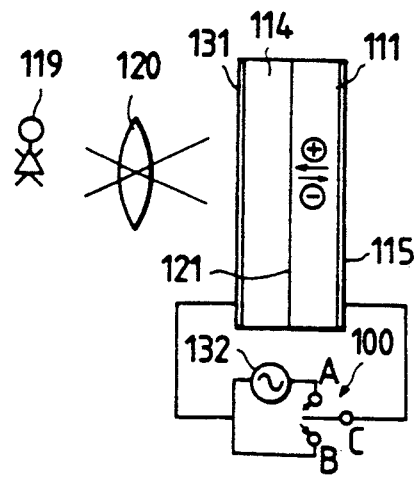
FIG. 23 is a diagram of an information recording apparatus according to a tenth embodiment of this invention.

With reference to FIG. 23, a lamination of a photoconductive layer 114 and a photo-modulation layer 111 is sandwiched between electrodes 115 and 131. The electrode 131 is transparent. The photoconductive layer 114 corresponds to the photoconductive layer PCL of FIG. 1. The photo-modulation layer 111 corresponds to the recording layer CML of FIG. 1. The electrode 115 is electrically connected to a movable contact C of a switch 100. The electrode 131 is electrically connected to a first terminal of an ac power source 132 and a fixed contact B of the switch 100. A second terminal of the ac power source 132 is connected to a fixed contact A of the switch 100. The movable contact C of the switch 100 is selectively connected to one of its fixed contacts A and B. When the movable contact C of the switch 100 is connected to its fixed contact A, an ac voltage of the ac power source 132 is applied between the electrodes 115 and 131 so that a corresponding ac electric field is generated between the electrodes 115 and 131. When the movable contact C of the switch 100 is connected to its fixed contact B, the application of the ac voltage between the electrodes 115 and 131 is removed.

The photo-modulation layer 111 is composed of a complex film of high molecular material and liquid crystal material. In the complex film, the liquid crystal is dispersed or impregnated in the high molecular material. It is preferable that the high molecular material has a volume resistivity of $10^{14} \phi$ cm or higher. The high molecular material is selected from various substances such as polyester resin and polycarbonate resin. The liquid crystal is of, for example, the nematic type or the smectic type.

Figure 24:
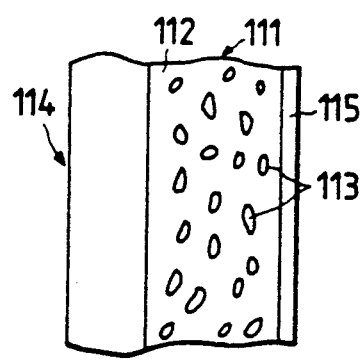
FIG. 24 is a sectional diagram of the photoconductive layer, the photo-modulation layer, and the electrode in the embodiment of FIG. 23.

As shown in FIG. 24, the photo-modulation layer 111 includes the high molecular member 112 having pores in which the liquid crystal 113 is trapped.

An optical image of an object 119 is formed via a lens 120 on the photoconductive layer 114. During an image recording process, the movable contact C of the switch 100 is connected to its fixed contact A so that the photoconductive layer 114 and the photo-modulation layer 111 are exposed to the ac electric field. The impedance of the photoconductive layer 114 varies in accordance with the optical image of the object O, so that the electric field applied to the photo-modulation layer 111 depends on the optical image of the object O. The application of the image-dependent electric field to the photo-modulation layer 111 forms a charge latent image on the photo-modulation layer 111. The charge latent image corresponds to the optical image of the object O.

The effect of the electric field on the complex film of the high molecular material and the liquid crystal in the photo-modulation layer 111 is independent of the polarity of the electric field but is dependent on the absolute intensity and the application time of the electric field.

Figure 25:
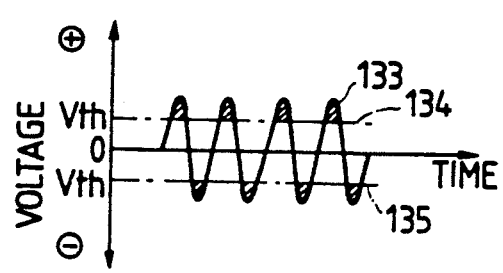
FIG. 25 is a diagram showing the waveform of the voltage applied between the electrodes in the embodiment of FIG. 23.

FIG. 25 shows time-dependent variations in the ac voltage 133 applied to the photo-modulation layer 111. The photo-modulation layer 111 reacts with the applied voltage 133 only during periods corresponding to the hatched regions of FIG. 25. Specifically, when the intensity of the applied voltage 133 exceeds a positive threshold 134 or a negative threshold 135, the reaction of the photo-modulation layer 111 with the applied voltage 133 occurs and advances.

In the embodiment of FIGS. 23–25, provided that the frequency of the applied ac voltage is set to an adequately high value, it is possible to prevent a deterioration of the recorded charge latent image due to a diffusion along the boundary plane 121 between the photo-modulation layer 111 and the photoconductive layer 114.

The photo-modulation layer 111 may be made of PLZT. The photo-modulation layer 111 and the photoconductive layer 114 may be separated from each other by a given gap.

DESCRIPTION OF THE ELEVENTH PREFERRED EMBODIMENT

Figure 26:
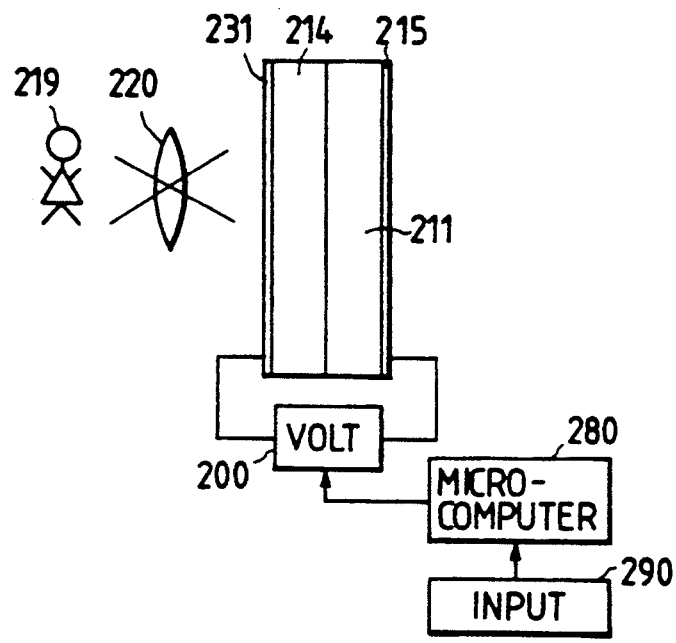
FIG. 26 is a diagram of an information recording apparatus according to an eleventh embodiment of this invention.

With reference to FIG. 26, a lamination of a photo-modulation layer 211 and a photoconductive layer 214 is sandwiched between electrodes 215 and 231. The photo-modulation layer 211 corresponds to the recording layer CML of FIG. 1. The photoconductive layer 214 corresponds to the photoconductive layer PCL of FIG. 1. The electrode 231 is transparent. A voltage generator 200 is electrically connected between the electrodes 215 and 231 so that the voltage generated by the voltage generator 200 can be applied between the electrodes 215 and 231. The application of the voltage to the electrodes 215 and 231 generates an electric field between the electrodes 215 and 231.

An optical image of an object 219 is formed via a lens 220 on the photoconductive layer 214. The impedance of the photoconductive layer 214 varies in accordance with the optical image of the object 219, so that the electric field applied to the photo-modulation layer 211 depends on the optical image of the object 219. The application of the image-dependent electric field to the photo-modulation layer 211 forms a charge latent image on the photo-modulation layer 211. The charge latent image corresponds to the optical image of the object 219.

The voltage generator 200 is controlled by a microcomputer 280 having a combination of an I/O circuit, a ROM, a RAM, and a CPU. A signal representative of recording conditions is inputted into the microcomputer 280 via a manual input device 290 such as a combination of switches. The microcomputer 280 operates in accordance with a program stored in the internal ROM. The program includes a step which determines a desired level of the voltage applied between the electrodes 215 and 231 on the basis of the input recording conditions by referring to a preset relation between the desired voltage level and the recording conditions. The program also includes a step which determines a desired time of the application of the voltage between the electrodes 215 and 231 on the basis of the input recording conditions by referring to a preset relation between the desired time and the recording conditions. The desired level of the voltage between the electrodes 215 and 231 and the desired time of the application of the voltage between the electrodes 215 and 231 have a predetermined relation since the desired level of the voltage and the desired time of the voltage application are dependent on the input recording conditions. The program further includes a step which controls the voltage generator 200 in accordance with the desired level of the voltage and the desired time of the voltage application. As a result of this control step, the voltage generator 200 applies a voltage between the electrodes 215 and 231 during a period equal to the desired time of the voltage application, and the level of the actually applied voltage is set equal to the desired level of the voltage.

Figure 27:
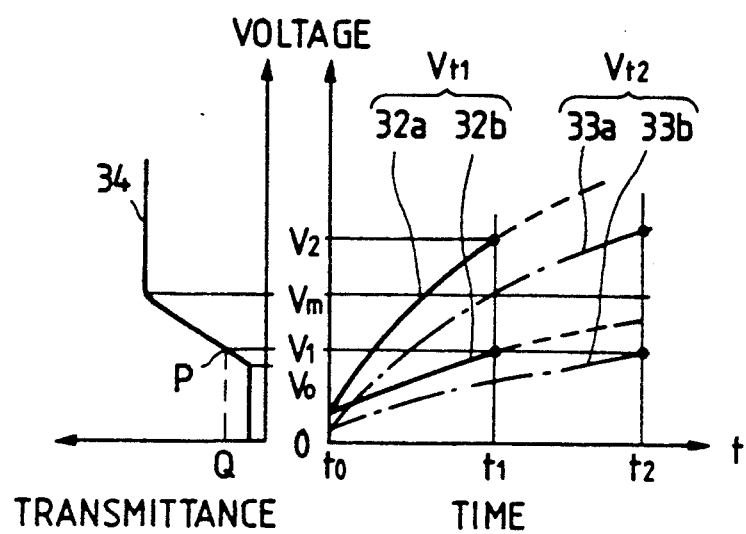
FIG. 27 is a diagram showing the relation among the voltage applied to the photo-modulation layer, the transmittance of the photo-modulation layer, and the time of the application of the voltage in the embodiment of FIG. 26.

FIG. 27 is a graph in which the ordinate denotes the voltage applied to the photo-modulation layer 211, and the rightwardly-directed abscissa denotes the time of the application of the voltage and the leftwardly-directed abscissa denotes the transmittance of the photo-modulation layer 211. The electric resistance of the photoconductive layer 214 varies in accordance with the brightness and the darkness of the formed image. In the case where the voltage Vt1 is applied between the electrodes 215 and 231, since the photoconductive layer 214 has a finite capacitive impedance, the voltages applied to the bright part and the dark part of the photo-modulation layer 211 increase along the curves 232a and 232b in a time domain respectively.

In FIG. 27, the transmittance of the photo-modulation layer 211 varies with the applied voltage along the curve 234. Specifically, the transmittance of the photo-modulation layer 211 increases as the applied voltage rises from a value Vo, and the transmittance of the photo-modulation layer 211 remains constant as the applied voltage increases from a specified value Vm. In the case where an optimal operating point of the black level of the photo-modulation layer 211 agrees with the point P (the voltage V1 and the transmittance Q), ideal recording can be done by setting the voltage application time equal to the voltage application time t1 during which the voltage of the dark part of the photo-modulation layer 211 varies to the value V1 along the curve 232b. In other words, when the voltage application time is set to the time t1, ideal recording can be done by setting the applied voltage equal to the value V1.

In the case where the time t2 longer than the time t1 is selected as the voltage application time, it is preferable that the applied voltage is set to the value Vt2 which enables the voltage of the dark part of the photo-modulation layer 211 to reach the value V1 during the voltage application time t2.

Figure 28:
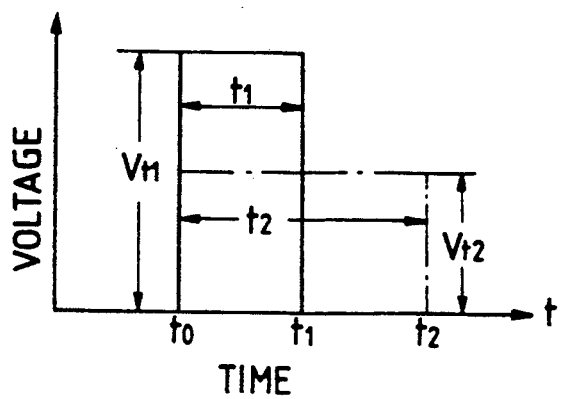
FIG. 28 is a diagram showing the relation between the level of the applied voltage and the period of the application of the voltage in the embodiment of FIG. 26.

FIG. 28 is a graph showing the relation between the applied voltage and the voltage application time. The moment of the start of the voltage application is denoted by t0. The voltage application time is set to the shorter time between the moments t0 and t1 for a higher applied voltage Vt1, and is set to the longer time between the moments t0 and t2 for a lower applied voltage Vt2. In this way, the applied voltage and the voltage application time have a predetermined relation with each other.

Figure 29:
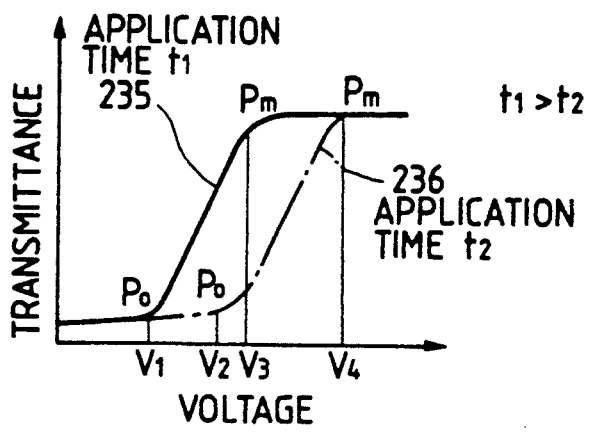
FIG. 29 is a diagram showing the relation between the applied voltage and the transmittance of the photo-modulation layer in the embodiment of FIG. 26.

FIG. 29 is a graph showing the relation between the transmittance of the photo-modulation layer 211 and the applied voltage with the voltage application time being used as a parameter under conditions where the photo-modulation layer 211 is composed of a complex film of higher molecular material and liquid crystal material. In FIG. 29, the voltage application times corresponding to the curves 235 and 236 are denoted by t1 and t2 respectively. The voltage application time t1 is longer than the voltage application time t2. In the range of the applied voltage between the values V1 and V4, the transmittances corresponding to the curves 235 and 236 are different from each other for equal applied voltages. Thus, the transmittance depends on both of the applied voltage and the voltage application time. Accordingly, the setting of the applied voltage in dependence on the voltage application time is effective in maintaining the optimal operating point during the recording process.

DESCRIPTION OF THE TWELFTH PREFERRED EMBODIMENT

Figure 30:
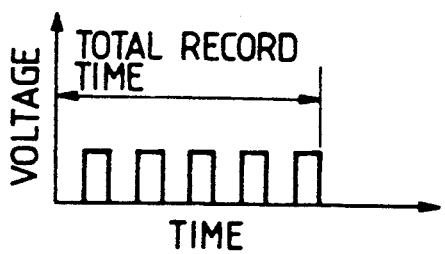
FIG. 30 is a diagram showing the waveform of an applied voltage in a twelfth embodiment of this invention.

FIG. 30 relates to a twelfth embodiment of this invention which is similar to the embodiment of FIGS. 26-29 except for the following design change. In the embodiment related to FIG. 30, periodical voltage pulses are applied between the electrodes 215 and 231 (see FIG. 26) during a predetermined time corresponding to a desired voltage application time.

DESCRIPTION OF THE THIRTEENTH PREFERRED EMBODIMENT

Figure 31:
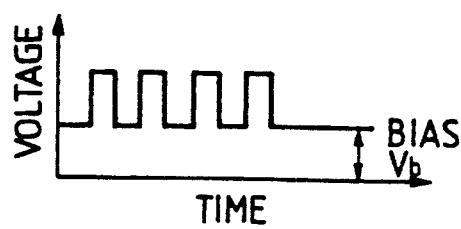
FIG. 31 is a diagram showing the waveform of an applied voltage in a thirteenth embodiment of this invention.

FIG. 31 relates to a thirteenth embodiment of this invention which is similar to the embodiment of FIGS. 26-29 except for the following design changes. In the embodiment related to FIG. 31, a predetermined bias voltage Vb is continuously applied between the electrodes 215 and 231 (see FIG. 26), and periodical voltage pulses are applied between the electrodes 215 and 231 during a predetermined time corresponding to a desired voltage application time. The periodical voltage pulses are superimposed on the bias voltage Vb.

DESCRIPTION OF THE FOURTEENTH PREFERRED EMBODIMENT

Figure 32:
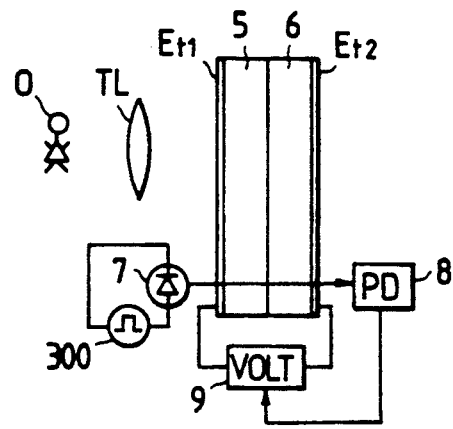
FIG. 32 is a diagram of an information recording apparatus according to a fourteenth embodiment of this invention.

FIG. 32 shows a fourteenth embodiment of this invention which is similar to the embodiment of FIGS. 18–20 except for the following design change. In the embodiment of FIG. 32, a generator 300 feeds a pulse drive signal to the light source 7 so that the light source 7 is activated by the pulse drive signal. The light source 7 emits pulses of the reference light in response to the pulse drive signal, and the pulses of the reference light are applied to the photoconductive layer 5. Since the reference light applied to the photoconductive layer 5 has a train of pulses, the photoconductive layer 5 is prevented from being saturated by the exposure to the reference light.

With respect to the photoconductive layer 5, the exposure quantity of the reference light may be greater than the exposure quantity of the information light.

Figure 33:
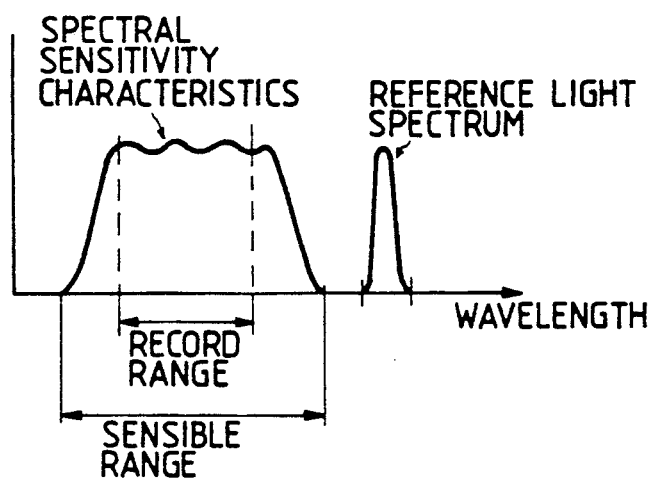
FIG. 33 is a graph showing the relation between the spectrum of the reference light and the spectral sensitivity characteristics of the photoconductive layer in the embodiment of FIG. 32.

As shown in FIG. 33, it is preferable that the wavelength of the reference light lies outside a spectral sensible range of the photoconductive layer 5.

DESCRIPTION OF THE FIFTEENTH PREFERRED EMBODIMENT

Figure 34:
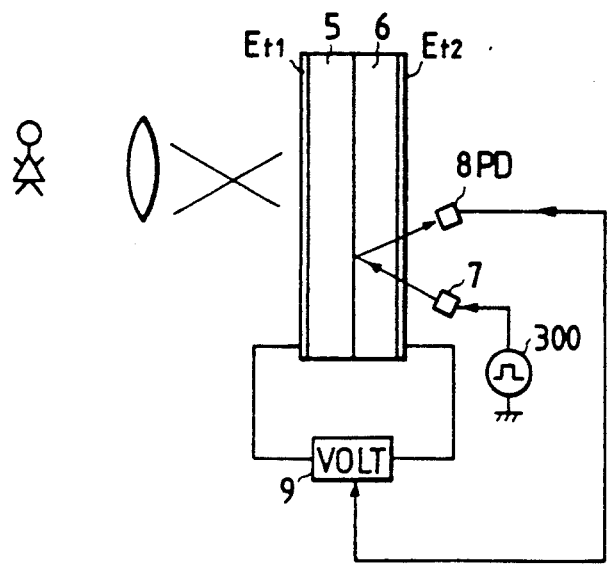
FIG. 34 is a diagram of an information recording apparatus according to a fifteenth embodiment of this invention.

FIG. 34 shows a fifteenth embodiment of this invention which is similar to the embodiment of FIGS. 32–33 except for the following design change. In the embodiment of FIG. 34, the reference light pulses emitted from the light source 7 enter the photo-modulation layer 6 via the electrode Et2 and are reflected at the boundary between the photo-modulation layer 6 and the photoconductive layer 5, moving back through the photo-modulation layer 6 and the electrode Et2 and being incident to the photo detector 8.

DESCRIPTION OF THE SIXTEENTH PREFERRED EMBODIMENT

Figure 35:
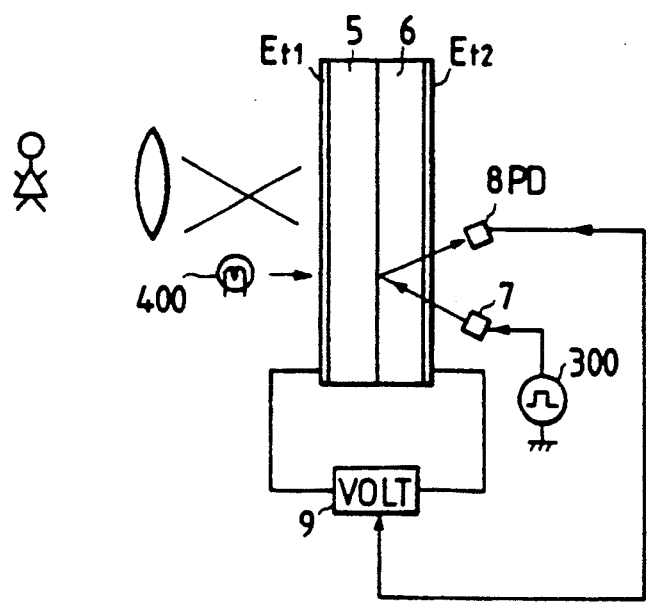
FIG. 35 is a diagram of an information recording apparatus according to a sixteenth embodiment of this invention.

FIG. 35 shows a sixteenth embodiment of this invention which is similar to the embodiment of FIG. 34 except for the following design change. In the embodiment of FIG. 35, an additional light source 400 applies light to the regions of the photoconductive layer 5 and the photo-modulation layer 6 which are exposed to the reference light.

DESCRIPTION OF THE SEVENTEENTH PREFERRED EMBODIMENT

Figure 36:
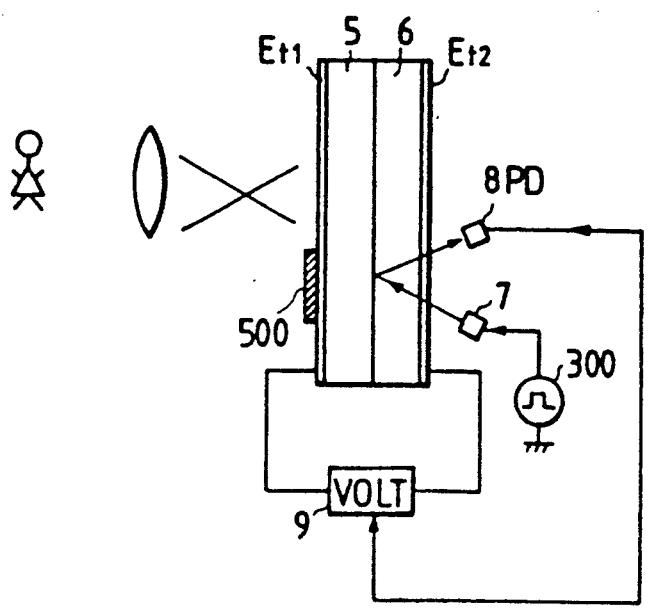
FIG. 36 is a diagram of an information recording apparatus according to a seventeenth embodiment of this invention.

FIG. 36 shows a seventeenth embodiment of this invention which is similar to the embodiment of FIG. 34 except for the following design change. In the embodiment of FIG. 36, an opaque mask 500 formed on the electrode Et1 extends over the regions of the photoconductive layer 5 and the photo-modulation layer 6 which are exposed to the reference light. The voltage applied between the electrodes Et1 and Et2 is controlled so that the reaction of the photo-modulation layer 6 which corresponds to the black level will be constant.

What is claimed is:

1. In a system having a first electrode, a second electrode, a photosensitive member located between the first and second electrodes, a recording member located between the first and second electrodes, and an optical shutter, a method comprising the steps of:
    applying light to the photosensitive member, the light having information to be recorded;
    recording the light information on the recording member;
    setting an exposure amount of the light with respect to the photosensitive member by setting a time during which the optical shutter remains open;
    applying a drive voltage of a predetermined variation manner between the first and second electrodes during recording of the light information on the recording member; and
    enabling an open period of the optical shutter and a period of the application of the drive voltage between the first and second electrodes to be different from each other in at least one of time length and time position.

2. The method of claim 1 wherein the open period of the optical shutter and the period of the application of the drive voltage between the first and second electrodes are selected to optimize exposure characteristics of said photosensitive member.

3. The method of claim 1 further comprising the step of applying the drive voltage between the first and second electrodes during a period which contains an open period of the optical shutter and which is longer than the open period of the optical shutter.

4. The method of claim 1 further comprising the step of applying a bias voltage between the first and second electrodes during a period longer than an open period of the optical shutter.

5. The method of claim 1 further comprising the step of enabling a period of the application of the drive voltage between the first and second electrodes to be shorter than the open period of the optical shutter.

6. In a system having a first electrode, a second electrode, a photosensitive member located between the first and second electrodes, a recording member located between the first and second electrodes, and an optical shutter, a method comprising the steps of:
    applying a predetermined voltage between the first and second electrodes during a predetermined period;
    applying light to the photosensitive member, the light having information to be recorded;
    recording the light information on the recording member;
    setting an exposure amount of the light with respect to the photosensitive member by setting a time during which the optical shutter remains open;
    during a period different from the predetermined period of application of the predetermined voltage, setting a drive voltage between the first and second electrodes in a condition where the recording member remains unchanged; and
    enabling an open period of the optical shutter and a period of the application of the drive voltage between the first and second electrodes to be different from each other in at least one of time length and time position.

7. The method of claim 6 further comprising the step of connecting an element of a predetermined impedance between the first and second electrodes.

8. The method of claim 6 further comprising the step of directly connecting the first and second electrodes during a period different from the predetermined period of the application of the predetermined voltage.

9. An apparatus comprising:
    an optical shutter for setting an exposure light amount;
    a photosensitive member exposed to an optical image of an object when the optical shutter is open;

a recording member recording information corresponding to the optical image when the optical shutter is open;

first and second electrodes for applying an electric field to the photosensitive member and the recording member when a potential is applied between the first and second electrodes;

means for applying a voltage between the first and second electrodes; and means for changing the voltage applied between the first and second electrodes wherein an open period of the optical shutter and a period of the application of the drive voltage between the first and second electrodes are different from each other in at least one of time length and time position.

10. The apparatus of claim 9 where wherein the open period of the optical shutter and the period of the application of the drive voltage between the first and second electrodes are selected to optimize exposure characteristics of said photosensitive member.

11. The apparatus of claim 9 wherein the first electrode and the photosensitive member are attached to each other.

12. The apparatus of claim 9 wherein the photosensitive member and the recording member compose a recording medium.

13. The apparatus of claim 9 further comprising a color separator for separating the optical image into different color components.

* * * * *

UNITED STATES PATENT AND TRADEMARK OFFICE
CERTIFICATE OF CORRECTION

PATENT NO. : 5,315,410
DATED : May 24, 1994
INVENTOR(S) : Itsuo TAKANASHI et al.

It is certified that error appears in the above-indentified patent and that said Letters Patent is hereby corrected as shown below:

On the title page delete item [75] and replace with the following:

--[75]  Inventors:  Itsuo Takanshi, Kamakura;
Shintaro Nakagaki, Miura;
Tsutou Asakura; Masato Furuya,
both of Yokohama; Yoshihisa
Koyama, Yokosuka; Yuji
Uchiyama, Chigasaki, all of
Japan--

Signed and Sealed this

Eleventh Day of October, 1994

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,315,410
DATED : May 24, 1994
INVENTOR(S) : Itsuo TAKANASHI et al.

It is certified that error appears in the above-indentified patent and that said Letters Patent is hereby corrected as shown below:

On the title page delete item [75] and replace with the following:

--[75]   Inventors:    Itsuo Takanashi, Kamakura; Shintaro Nakagaki, Miura; Tsutou Asakura; Masato Furuya, both of Yokohama; Yoshihisa Koyama, Yokosuka; Yuji Uchiyama, Chigasaki, all of Japan--

This certificate supersedes Certificate of Correction issued October 11, 1994.

Signed and Sealed this

First Day of August, 1995

Attest:

BRUCE LEHMAN

Attesting Officer    Commissioner of Patents and Trademarks